(12) United States Patent
Zach et al.

(10) Patent No.: US 7,973,289 B2
(45) Date of Patent: Jul. 5, 2011

(54) METHOD FOR PRODUCING IMAGE CONTRAST BY PHASE SHIFTING IN ELECTRON OPTICS

(75) Inventors: Joachim Zach, Oestringen (DE); Harald Rose, Darmstadt (DE)

(73) Assignee: CEOS Corrected Electron Optical Systems GmbH, Heidelberg (DE)

( * ) Notice: Subject to any disclaimer, the term of this patent is extended or adjusted under 35 U.S.C. 154(b) by 290 days.

(21) Appl. No.: 12/405,279

(22) Filed: Mar. 17, 2009

(65) Prior Publication Data

US 2010/0213369 A1    Aug. 26, 2010

(30) Foreign Application Priority Data

Feb. 26, 2009  (DE) .................. 10 2009 010 774

(51) Int. Cl.
*G01N 23/00* (2006.01)
(52) U.S. Cl. .................. 250/396 R; 250/306; 250/307; 250/310; 250/311; 250/396 ML
(58) Field of Classification Search .......... None
See application file for complete search history.

(56) References Cited

U.S. PATENT DOCUMENTS 7,741,602 B2 * 6/2010 Benner et al. ............. 250/311
2008/0296509 A1 * 12/2008 Schroder et al. ........... 250/398

FOREIGN PATENT DOCUMENTS

DE     10 2006 055 510        5/2008

OTHER PUBLICATIONS

Harald H. Rose "Geometrical Charged-Particle Optics", Springer-Verlag, Berlin (2009), pp. 81-83.
Ludwig Reimer and Helmut Kohl "Transmission Electron Microscopy", Springer-Verlag, Berlin (2008), pp. 211-221.

* cited by examiner

*Primary Examiner* — Robert Kim
*Assistant Examiner* — Michael J Logie
(74) *Attorney, Agent, or Firm* — Paul Vincent (57) ABSTRACT

According to the invention, the image contrast in electron optics can be improved without causing aberrations that are no longer tolerable by using, for production and correction of the at least one anamorphic image, quadrupole fields before and after this image whose extent in the direction of the optical axis is equal to at least twice their focal length, and wherein at least one of the axial rays, by an appropriate choice of the magnification M of the intermediate image, enters the quadrupole field before the at least one anamorphic image at a slope 1/M such that a length of the anamorphic image is achieved at which any aberrations caused are still within a tolerable range. The invention also relates to devices for implementing this method.

28 Claims, 6 Drawing Sheets

METHOD FOR PRODUCING IMAGE CONTRAST BY PHASE SHIFTING IN ELECTRON OPTICS

BACKGROUND OF THE INVENTION

The invention relates to a method for producing image contrast by phase shifting in electron optics, wherein, starting from an intermediate image, an anamorphic image of the axial rays is produced by quadrupole fields with simultaneous passage through zero of the field rays in at least one diffraction intermediate image plane, where a relative phase shift between a region around the electron beam of zeroth order of diffraction and the electron beams of higher orders of diffraction is caused by a magnetic or electric field, and thereafter the at least one anamorphosis of the beam path produced is corrected again by further quadrupole fields.

The invention also relates to a device for performing the method with entry side quadrupole elements that, from an intermediate image, produce quadrupole fields such that the axial rays and the field rays are focused and defocused in two perpendicular sections in such a way that, in a diffraction intermediate image plane, the axial rays form an anamorphic image and the field rays each pass through zero, wherein, in the region of the diffraction intermediate image plane, a central quadrupole element is disposed with a quadrupole field such that the axial rays exit the field with slopes opposite to those for the entry into the field, and wherein two further quadrupole elements produce quadrupole fields that have the same magnitude and sign as the quadrupole fields of the quadrupole elements on the entry side, so that the anamorphosis of the beam path is corrected again, and wherein, in the diffraction intermediate image plane, a phase-shifting element is disposed whose magnetic or electric field is arranged in such a way that a relative phase shift is caused between the region of the electron beam of zeroth order of diffraction and the electron beams of higher orders of diffraction.

The invention also relates to a device for performing a method with entry-side quadrupole elements that, from an intermediate image, produce quadrupole fields such that the axial rays and the field rays are focused and defocused in two perpendicular sections in such a way that, in a diffraction intermediate image plane, the axial rays form an anamorphic image and the field rays each pass through zero, wherein, in the region of the diffraction intermediate image plane, a central quadrupole element is disposed with a quadrupole field such that the axial rays exit the field with slopes opposite to those for entry into the field, and wherein, in the diffraction intermediate image plane, a first phase-shifting element is disposed whose magnetic or electric field is arranged in such a way that a relative phase shift is caused between the region of the electron beam of zeroth order of diffraction and the electron beams of higher orders of diffraction.

As in light microscopy, in electron microscopy many specimens are almost transparent to the beam so that only very little amplitude contrast is achieved with conventional imaging. However, both the axial ray and the field rays are subject to a local phase shift that depends on the structure of the specimen on passing through the specimen. This splits the beam into a non-diffracted zero beam and diffracted beams of multiple orders of diffraction in the specimen.

If a phase shift is imposed on the zero beam, preferably 90°, the phase modulation of the specimen is converted to a strong amplitude contrast when the diffracted beams are again superimposed on the zero beam in the image plane. This is the known phase contrast (see, for example, Reimer, Kohl, "Transmission Electron Microscopy," p. 211 ff, 5$^{th}$ Edition, 2008). Such a phase shift is achieved using the fact that beams form different focal points in the focal plane of the objective lens. The zero beam thus forms a central focal point in the focal plane for the zero beam and is surrounded by the focal points of the diffracted beams of the various orders of diffraction, starting with the diffraction of the first order, which are essentially all in the same focal plane. This fact can be used to cause a phase shift either of the zero beam or of the diffracted beams to cancel out the phase difference, thus amplifying the amplitudes.

Unlike in light optics, however, with electron beams there is the problem that there is no transparent plate for them that could hold a phase plate. To solve this problem, phase-shifting elements of many different types have therefore been suggested based on the fact that the phase-shifting element reaches right through the region of the diffracted beams to influence the zero beam. It must be noted that it is not technically feasible to influence only the zero beam because this would require an electric field in the nanometer range, which cannot be produced with current technical possibilities. For that reason, depending on the nature of the phase-shifting elements used, diffracted beams are also affected at least to a small degree. In many of these suggestions, the phase-shifting element has an annular structure that includes the region of the zero beam in order to apply the field required to phase-shift the zero beam there. However, this shades diffracted beams to a not inconsiderable degree, which are then not available for contrast production. For that reason, DE 10 2006 055 510 A1 proposed a phase-shifting element that extends on one side only up to the region of the zero beam to apply the necessary field there. Because, in this way, no regions are shaded that are mutually offset by 180°, with this phase-shifting element it is possible to reconstruct the shaded portions of the diffracted beams and fully use them for contrast production.

Another solution to this problem are phase-shifting elements of the type stated above that were proposed by DE 10 2007 007 923 A1. They work according to the method stated above based on the fact that an anamorphic image is produced in a diffraction intermediate image by quadrupole fields, which make it possible to reach the zero beam or the diffracted beams with a field in order to cause a relative phase shift between the region around the electron beam of zeroth order of diffraction and the electron beams of higher orders of diffraction. In this way, no component of the device shades diffracted beams. This has the further advantage that separate influencing of these beam components and therefore contrast production is considerably improved. The zero beam and diffracted beams are sequenced from the center outward in the anamorphic image so that it is possible to affect both the zero beam and the diffracted beams relatively precisely with one field. However, it is not possible to extend the length of the anamorphic image to an unlimited degree to achieve good influencing of either the zero beam or the diffracted beams because such an extension is limited both technically by the size of the tube of the electron microscope containing the electron-optical system and by the fact that extending the length of the anamorphic image beyond a certain point results in errors that are no longer tolerable, thus forfeiting the desired high image quality again.

The object of this invention is therefore to improve the image contrast in the method and the two devices stated above without causing errors that are no longer tolerable.

SUMMARY OF THE INVENTION

The object with respect to the method stated above is inventively solved by the fact that, for the production and correction of at least one anamorphic image, quadrupole fields disposed before and after this image are used whose extent in the direction of the optical axis is at least twice their focal length, and wherein, through appropriate selection of a magnification M of the intermediate image, at least one of the axial rays runs into the quadrupole field before the at least one anamorphic image at a slope 1/M such that a length of the anamorphic image is achieved at which aberrations caused are still within a tolerable range.

With respect to the first device of the type stated above, the object is solved by the fact that the quadrupole elements disposed before and after the diffraction intermediate image plane have an extent in the direction of the optical axis that corresponds to at least twice their focal length and by the fact that the device is constituted for disposition at a position of the beam path of the projective lens system of an electron microscope at which, after formation of an intermediate image with magnification M, the axial rays enter the quadrupole field of the second quadrupole before the anamorphic image with a slope 1/M such that the length of the anamorphic image is manageable while producing aberrations that are still within a tolerable range.

With respect to the second device of the type stated above, the object is solved by the fact that a quadrupole element is disposed after the diffraction intermediate image plane and the quadrupole elements before and after the diffraction intermediate image plane have an extent in the direction of the optical axis that corresponds to at least twice their focal length; by the fact that, after a symmetry plane that is central with respect to all quadrupole elements, three quadrupole elements follow whose fields are essentially equal in magnitude to the fields of the three quadrupole elements before them but rotated through 90°; by the fact that a quadrupole then follows with a field having the same magnitude but rotated through 90° with respect to the field of the first quadrupole; by the fact that the fields of the quadrupole elements located before and after the diffraction intermediate image plane can be set to deviate from each other in such a way that the axial rays in the central symmetry plane form a further intermediate image of magnification M and the field rays intersect each other, and wherein the corresponding quadrupole elements after the central symmetry plane whose fields are rotated through 90° can also be set to deviate in such a way that a third intermediate image of size M is produced at the end of the device so that the axial rays and the field rays run through these fields in the x-section in the same way as through the first four fields in the y-section, and in the y-section in the same way as through the first four fields in the x-section, wherein, in the second central quadrupole element, a second diffraction intermediate image plane results with a further anamorphic image that is rotated through 90° with respect to the first anamorphic image; by the fact that, in the second diffraction intermediate image plane, a second phase-shifting element is disposed whose magnetic or electric field is arranged in such a way that a relative phase shift is caused between the region of the electron beam of zeroth order of diffraction and the electron beams of higher orders of diffraction; and by the fact that the device is constituted for disposition at a position of the beam path of the projective lens system of an electron microscope at which, after formation of an intermediate image with magnification M, the axial rays enter the quadrupole field of the second quadrupole in front of the anamorphic image with a slope 1/M such that the length of the anamorphic image is manageable while producing aberrations that are still within a tolerable range.

The invention is based on the realization that good phase contrast production depends not only on the length of the anamorphic image but also on the ratio of its length to its width, that is, on the aspect ratio. The greater this aspect ratio, the more successful influencing will be either purely of the zero beam or of as many of the diffraction orders as possible, in particular of the first order, which is nearest to the zero beam.

Given this knowledge, it was possible to define the aim based on the object stated above that only a length of the anamorphic image would be permitted for which no non-tolerable aberrations result but while taking measures to considerably increase the aspect ratio. Aberrations are deemed tolerable if they do not impair the image quality in a way that is in any way disadvantageous for image evaluation.

While complying with the length of the anamorphic image, three parameters are available to achieve a large aspect ratio: the first is the extent in the axial direction of the quadrupole elements and therefore also of the quadrupole fields that are before the diffraction intermediate image plane(s), which, of course, applies to an equal extent to the quadrupole element(s) or quadrupole fields after the diffraction intermediate image plane(s) to compensate for the intentionally caused image distortion again. It has been shown that, to achieve the desired large aspect ratio, this extent in the axial direction should be equal to at least twice the focal length of these quadrupole elements. The second parameter, that is, the field strength of the quadrupole elements is, of course, connected to this axial extent because the focal length is the measure of this extent. Appropriately sized field strengths avoid the quadrupole elements having to be constructed with a length that is disadvantageous from the point of view of equipment design. The field strengths therefore have to be so large that the overall height of the corresponding devices does not increase the lengths of beam tubes of usual electron microscopes to the extent that they cannot be installed in usual spaces for this purpose.

Finally, it is also necessary for the axial rays to enter the quadrupole fields before the diffraction intermediate image plane(s) with a certain slope to achieve a large aspect ratio while complying with the length of the anamorphic image, and with manageable equipment dimensions. According to the Helmholtz law (Prof. Rose "Geometrical Charged-Particle Optics," p. 81 ff) from an intermediate image with an image with magnification M, axial rays with a slope of 1/M emanate that then result in a diffraction intermediate image reduced by M (Rose, ibid. p. 82, "Lagrange-Helmholtz formula"). Simply expressed, a large magnification of the intermediate image has a shallow slope of the axial rays and this, in turn, results in a correspondingly reduced diffraction image. By choosing the right magnification M of the intermediate image, it is thus possible to select slope 1/M of the axial rays and therefore such a small virtual diffraction image that, in the diffraction intermediate image plane, an anamorphic image with a large aspect ratio and therefore with an acceptable length can then be achieved. The anamorphic image is produced from axial rays with the slope 1/M that would result in an excessively reduced diffraction image without positioning of the quadrupole fields. However, because the quadrupole fields exert their influence beforehand, this remains virtual and the quadrupole fields influence the axial rays in such a way that the anamorphic image is correspondingly reduced in the diffraction intermediate image plane so that it is extremely narrow while still having a manageable length, that is, it has a large aspect ratio. Therein, the zero beam is located in the center and the diffracted beams are sequenced toward the outside. This permits optimum phase shifting of the zero beam or the diffracted beams without impairing the image and without exceeding an acceptable overall equipment size.

If, on the other hand, quadrupoles are used whose axial extent is far smaller than twice the focal length, as are referred to, for example, in DE 10 2007 007 923 A1, FIGS. 17 and 18, an aspect ratio greater than 10 cannot be achieved unless a length of the anamorphic image is accepted at which aberrations are caused that noticeably impair the image quality. This would then also be unmanageable in terms of equipment design because increasing the diameter of the beam tube of an electron microscope to provide space for a very long anamorphic image is not acceptable. Instead, the devices must be based on the usual dimensions of electron microscopes if they are to be accepted by manufacturers as installable functional elements.

The invention, on the other hand, aims to achieve aspect ratios that are greater than 100 and, if possible, even greater than 200 to achieve contrast-rich images without image impairment and with a device size that is manageable and acceptable in terms of equipment design. This is only possible by the means stated above, in particular, a shallow slope of the axial rays 1/M departing from a large intermediate image (of magnification M) can be used to achieve an anamorphic image with an aspect ratio greater than 100, only if the quadrupole element before the diffraction intermediate image plane or its field has an axial extent of at least twice the focal length for the corresponding field strength so that an acceptable overall height results. If a second anamorphic image is produced, the same applies to it because of the antisymmetrical conditions for the beam path; this will be explained in more detail.

The inventive devices must be adapted to each design type of electron microscope. The position in the projective lens system with magnification M of the intermediate image is selected for installation of the device in the manner stated above to match the specific design type. The magnitude of this magnification of M selected, in turn, depends on the design of electron microscope. In the case of electron microscopes with a high resolution and large magnification, a larger aspect ratio of 200 or more is desirable and therefore also a larger magnification M is selected than for devices in which a smaller aspect ratio is required. If the requirements of electron microscopes are less, the diameter of the beam tube is also smaller and the overall height of the equipment is such that it can be installed in a work room with a normal ceiling height. In this case, a smaller magnification M of the intermediate image and a smaller aspect ratio are sufficient. However, the length of the anamorphic image must also be shorter and the focal lengths of the quadrupoles disposed before and after the diffraction intermediate image plane must also be shorter to limit their overall height. This must take account of the lower overall height and smaller beam tube diameter of such equipment. Equipment subject to greater requirements has beam tubes with a much larger diameter because the dimensions of the lenses are larger in accordance with the wider beams. Such equipment also has a greater overall height and rooms are therefore also provided for installing them that have a correspondingly higher ceiling. This permits enlargement of the above-mentioned dimensioning, but then the requirements for phase contrast to be achieved are correspondingly greater.

The relative dimensions of the features of the inventive devices must then be selected depending on the circumstances and the desired requirements. In the case of a high-resolution electron microscope, for example, it would be possible to select an aspect ratio of 400. To manage such a large aspect ratio, a larger length of the anamorphic image should then be selected. In a beam tube with a large diameter, the anamorphic image can also have this larger length without causing non-tolerable aberrations. Accordingly, an intermediate image with a large magnification would be chosen and the anamorphic image selected such that, in accordance with the acceleration voltage and the beam path of the equipment in question, the length of the anamorphic image within the given tube diameter of the beam tube is both feasible in terms of equipment dimensions and oriented toward keeping the aberrations caused within a tolerable range.

The specialist thus has parameters he or she needs to specify the relative data for each equipment design in keeping with the design of the electron microscope in question, its size, and the equipment requirements.

As is known, the quadrupole fields can be magnetic or electric fields, this is immaterial to the working principle. Also for the phase shift, electric or magnetic fields may be deployed, although electric fields are preferred both because especially strong fields are not required for this and because electric fields are more easily applied within a defined and limited spatial extent.

As for the method, in the simplest case, a single anamorphic image can be produced and corrected again using at least five quadrupole fields. Then it is most convenient if the magnetic or electric field applied there exhibits a field strength such that a relative phase shift of approximately 90° results. However, for certain objects, better contrast may be achieved by a different phase shift. A setting facility may be useful in this regard.

The field configuration can also be doubled so that the at least five quadrupole fields that deform the beam anamorphically and then reverse the deformation again are followed by at least another five quadrupole fields that have the reverse polarity. In this case, there must be an intermediate image between the two field configurations—that is, with regard to the elements in the symmetry plane and with regard to the fields in the anti-symmetry plane. To ensure that this further intermediate image arises after the last quadrupole field of the first field configuration, the fields must be disposed in such a way that the intermediate image is on the entry side of the field configuration before the first quadrupole field. If these conditions are fulfilled, an anti-symmetrical beam path results in such a way that in the second half of the device the axial rays and the field rays traverse the x-section in the same way as they previously traversed the y-section and traverse the y-section in the same way as they previously traversed the x-section. In this way, an anamorphic image, rotated by 90° with respect to the first anamorphic image, is produced and corrected. In this case, it is useful if, in the two anamorphic images produced, magnetic or electric fields are applied for relative phase shifting having field strengths such that this phase shift is approximately 45°. Of course, in this case, too, a different phase shift may be useful for certain specimens.

In the case of the said procedure, after exiting the quadrupole field following the first anamorphic image, the rays have the same slope as on entry into the quadrupole field disposed before the second anamorphic image. In this way, it is possible to transfer the rays immediately from the quadrupole field following the first anamorphic image to the quadrupole field that is disposed before the second anamorphic image. There is thus only one central symmetry plane with respect to the quadrupole element configuration which is also an anti-symmetry plane with respect to the fields. However, due to the omission of quadrupole fields, the two field configurations each exhibit no symmetry within themselves, which causes a deviation in the slope of the rays compared with the configuration with double symmetry described above. In this case, joining the field configurations requires setting options to achieve complete correction of each anamorphosis.

For this purpose, the quadrupole fields of the first field configuration that are located before and after the diffraction intermediate image plane are set to deviate from each other in such a way that the axial rays in the central symmetry plane form a further intermediate image of the magnification M and the field rays intersect each other. However, because, at the end of the device, a third intermediate image of size M must be formed, the corresponding quadrupole fields located before and after the second diffraction intermediate image plane must also be set to deviate from each other in such a way that a third intermediate image is produced that also exhibits magnification M.

The field configuration described above can then be such that, based on double symmetry, with five quadrupole fields in each case, the last and the first of the five quadrupole fields in question are omitted under the stated conditions, without this changing the anti-symmetry of the beam path nor therefore the overall function—if the corrections described above are made. In the case of a larger number of fields, enough of these can be omitted to assure the corresponding anti-symmetry of the beam path.

The advantage of the latter and the previously stated field configurations with a double phase shift of approximately 45° in each is that it achieves better image contrast for certain structures. However, in this case as well, there are exceptions with respect to the magnitude of the phase shift with certain specimens.

The relative phase shift between the region of the zero beam and the diffracted electron beams can be performed by applying a field to both beam regions. However, it is more useful for a phase shift to be applied only to one of these types of beam. In this way, a magnetic or electric field can only be produced in the region of the zero beam, for example, to cause a phase shift of approximately 90° or twice approximately 45°. Conversely, the magnetic or electric field can instead be applied only in the region of the diffracted beams to cause phase shifts of the type stated above.

It is convenient for the quadrupole fields for production and correction of the anamorphic image that are disposed immediately before and after the latter to exhibit such an extent in the direction of the optical axis and such a strength that an astigmatic intermediate image can be generated in the region affected by them. Because, in this way, the field strength also determines the extent in the direction of the optical axis, the latter should be limited by corresponding dimensioning of the field strength so that installation of a device working by this method into the electron microscope does not result in an unacceptable overall height of the design type of the electron microscope. The overall height depends on the device type in question and the heights of the working spaces that are usually provided for these equipment types. This specification of the extent in the direction of the optical axis corresponds to specification of at least twice the focal length so that both specifications lead to the same result. However, the latter is immediately visible from the axial beam path.

Also the question as to whether an aspect ratio greater than 100 or greater than 200 is selected depends on the magnification and resolution of the specific equipment type. The greater the requirements for the optical characteristics of the equipment, the greater the aspect ratio should be to be able to achieve the best possible image contrast due to the pulling apart of the regions of the zero beam and diffracted beams.

The inventive devices work by the method described above. The method and its embodiments thus reflect the working method of the devices and, conversely, disclosure of the devices based on their working method can be additionally used to describe the method.

The device already described above firstly relates to a structure that has a single symmetry plane having the at least five quadrupole elements described. These are necessary for the inventive phase shift. Of course, further quadrupole or multipole elements can be integrated into such a device to implement further functions such as correction of chromatic aberrations, aperture aberrations, or any axial or off-axial aberrations of various orders. Further quadrupole elements can also be used to implement the beam path necessary for the invention by more than the five quadrupole fields described.

The structure that has a single symmetry is intended to produce a single anamorphic image that is conveniently deployed to produce a relative phase shift of approximately 90° using a magnetic or electric field by means of a phase-shifting element. Of course, in the case of certain specimens, as already mentioned, a different phase shift may be used. It may also be convenient to set the device by changing the field of the phase-shifting element within a certain range, at least, in the vicinity of 90°, to produce the optimum contrast for the specimen in question.

In a further embodiment of the device described above, a second device is disposed after the first device on the optical axis whose quadrupole elements correspond to the quadrupole elements of the first device but whose fields have reversed polarity so that the anamorphic image is rotated through 90° with respect to the anamorphic image of the first device. It is also necessary for this device to be constituted to be disposed in the beam path of the projective lens system of the electron microscope in such a way that the intermediate image is located before the first quadrupole element and the two said devices are joined together to form one device in such a way that, in the central symmetry plane resulting from this joining, a further intermediate image of magnification M is formed. The phase-shifting element of the second device is then also rotated through 90° in such a way that it provides magnetic or electric fields for the relative phase shift between the region of the electron beam of zeroth order of diffraction and the electron beams of higher orders of diffraction of this second anamorphic image.

Due to serial connection of the first and a second device, this device constitutes a duplication of the device, a symmetry plane being located between the devices with respect to the configuration of the elements. However, the fields of the second device have reversed polarity with respect to those of the first device so that the axial rays and field rays traverse the x-section of the second device as they did the y-section of the first device and traverse the y-section of the second device as they did the x-section of the first device. This structure that has double symmetry results in an antisymmetrical beam path that produces a third intermediate image on the exit side after the last quadrupole element. In this case, good phase contrast is usually achieved because the phase-shifting elements acting on the two anamorphic images have electric or magnetic fields that result in a phase shift of approximately 45° in each case. Of course, different phase shifts may result in even better contrast for certain specimens.

The second device described above functions in the same way in principle. However, unlike the device described above, it does not exhibit double symmetry because the quadrupole element disposed before the second diffraction intermediate image plane immediately follows the quadrupole element disposed after the first diffraction intermediate image plane. Therefore based on the device discussed above, for example, the aspect that has been simplified compared with the joining of two devices with five quadrupole elements each is that, in the first device, the fifth quadrupole element and, in the second device, the first quadrupole element are omitted.

Such a device deviating from symmetry in two axes functions by the fact that the slopes of the rays that exit the quadrupole element disposed after the first diffraction plane have the same slope as that with which they must enter the quadrupole element that is disposed before the second diffraction plane. However, because the two joined partial devices are no longer symmetrical within themselves due to the omission of the two quadrupole elements, a deviation in the slopes of the rays occurs that requires a corrective measure. This corrective measure is the ability to set the fields of the quadrupole elements located before and after the diffraction intermediate image plane to deviate from one another in such a way that the axial rays in the central symmetry plane form a further intermediate image with magnification M and the field rays intersect each other. However, because the total symmetry with respect to the central symmetry plane must be maintained, the corresponding quadrupole fields of the second device part are controlled in the same way. Either simultaneous setting of the field strengths is performed, of course with reverse polarity, or the field strengths are set in a result-oriented fashion to produce a third intermediate image of size M at the end of the device. In principle, this must be identical but the method described above would also permit correction of aberrations due to manufacturing imprecision.

Of course, this applies accordingly to the joining of two corresponding devices having more than five quadrupole elements of which corresponding quadrupole elements are omitted and therefore at the joining point only the element disposed behind the first diffraction intermediate image plane and the element disposed behind the second diffraction intermediate image plane remain.

Consequently, the device, like the other devices and methods, contains only the quadrupole elements or fields necessary for the function of the invention. If further quadrupole elements or multipole elements or fields are additionally disposed, for example, to correct additional chromatic aberrations or other aberrations, these are irrelevant to the assessment of the invention because their different functions are only provided as an addition to the inventive functionality.

As regards all devices, the beam paths can, of course, be distributed over a multiplicity of further quadrupole elements, instead of five quadrupole elements for a device with symmetry in one axis or ten quadrupole elements for a device with symmetry in two axes. However, if the effect of one of the quadrupole fields is distributed, for example, over two fields, this still corresponds to the method of operation of the field that is essential to the invention, or of the corresponding inventive quadrupole element. This similarly applies to the device that deviates from symmetry in two axes by the fact that quadrupole elements are omitted on joining two single devices, if this omission nevertheless retains the anti-symmetry of the beam path.

As in the devices with double symmetry, in devices in which quadrupole elements have been omitted as compared with double symmetry, phase-shifting elements with magnetic or electric fields are disposed in each diffraction intermediate image plane, each of these preferably effecting a phase shift of approximately 45°.

In accordance with the method as well as for the case of devices, the quadrupoles for generating and compensating the at least one anamorphic image exhibit such an extent in the direction of the optical axis and are constituted for such a field production that production of an astigmatic intermediate image is possible in regions affected by them. In this case, too, the field strength must be chosen such that the axial extent of the quadrupoles only results in an overall height that still permits easy installation in an electron microscope. These dimensions result, as already described for the method, in the extent in the direction of the optical axis already stated, which is equal to at least twice the focal length, so that the dimensioning can be achieved in one or the other of the alternative ways.

For the phase-shifting element it is essential that its field cause a relative phase shift between the beams of the region of the electron beam of zeroth diffraction order and the electron beams of higher diffraction orders irrespective of whether it is a magnetic or an electric field. Given this premise, of course, the field could affect both types of beams, but it is beneficial if the phase-shifting element is constituted in such a way that the magnetic or electric field can be applied to the region of the zero beam while the region of the diffracted beams is at zero potential, or vice versa.

Specific embodiments of such phase-shifting elements are known from prior art; two possibilities are described here as examples:

One possible embodiment of a phase-shifting element for the application of a field in the region of the zero beam is a phase-shifting element producing an electric field and constituted as a shielded conductor that, departing from a fixture on the housing wall, is essentially disposed to extend radially in the direction of the region of the zero beam in the diffraction intermediate image plane, the shielded conductor having, before the region of the zero beam, an end that is positioned in such a way that, between the conductor and the shielding surrounding it, an electric field is formed that affects this region of the zero beam.

In another example of a phase-shifting element in which the area of the zero beam is at zero potential and the field can be applied in the area of the diffracted beams, the phase-shifting element has a slot for production of an electric field that encloses the anamorphic image, wherein electrodes for application of the electric field extend on both sides along the slot, each interrupted by a conductor at zero potential for the area of the zero beam in the region of the optical axis.

With this phase-shifting element, it is important that the anamorphic image is as close to the slot as possible with its longitudinal sides without touching it. For this reason, it is beneficial if the device is arranged in such a way that the quadrupole elements before and after the diffraction intermediate image plane produce fields such that the width of the anamorphic image just about fits into the width of the slot. In this way, even and targeted application of field to the diffracted beams is achieved.

The object of the invention is best achieved if such field strengths can be produced with the quadrupoles, and the device can be disposed at such a point of the beam path of the projective lens system of an electron microscope that the magnification M of the intermediate image results in a slope 1/M of the axial rays such that the aspect ratio of the at least one anamorphic image is greater than 100. For greater requirements with respect to contrast production, in particular, for higher resolution and strong magnification, the aspect ratio should be greater than 200 for the configuration and field strengths.

The invention is explained below using schematic diagrams. The figures show.

BRIEF DESCRIPTION OF THE DRAWING

DESCRIPTION OF THE PREFERRED EMBODIMENT

Figure 1:
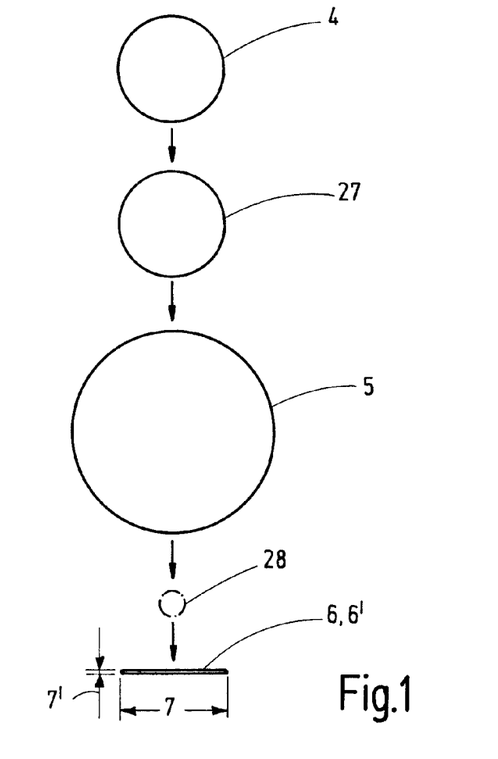
FIG. 1 a schematic diagram to illustrate the inventive idea.

FIG. 1 shows a schematic diagram illustrating the inventive idea. For technical background, please refer at this point to the description of the beam path in an electron microscope by Prof. Rose (ibid., p. 85, FIG. 4.9). This describes how all the intermediate images and diffraction images alternate in the beam path after the specimen (Rose, ibid., p. 79 "Theorem of alternating images"). The description of the electron microscope is simplified because usually not only a projective lens but an entire projective lens system 18 (FIG. 5) is present, resulting in further intermediate and diffraction images. The intermediate images result when the axial rays $x_\alpha$ and $y_\beta$ pass through zero as an image of the specimen and the diffraction images result when the off-axial rays $y_\gamma$ and $y_\delta$ pass through zero as an image of the beam source (FIG. 2a and FIG. 2b). This number of intermediate images is available to select an intermediate image 27 of magnification M that is required to achieve the desired aspect ratio.

FIG. 1 shows a schematic representation of how a diffraction intermediate image 27 is formed from a specimen 4 in an electron microscope 31 between an objective lens 17 and one of the inventive devices 1, 2, or 3 and an intermediate image 5, which magnifies the specimen 4 M times, is formed in the entry region of the devices 1, 2, or 3. The represented magnification M is only symbolic: in fact M is much larger than drawn in order to achieve a low slope 1/M that results in a greatly reduced diffraction image 28, which is the basis for reduction of the anamorphic image 6, 6'. However, this diffraction image 28 is usually a virtual diffraction image 28 because, before the diffraction image 28 is formed, the device 1, 2, or 3 intervenes in the beam path with slope 1/M to form the anamorphic image 6, 6'. The virtual diffraction image 28 is therefore inversely proportional to the magnification M of the intermediate image 5. Therefore a great magnification M can result in a correspondingly reduced diffraction image 28, or, because it is virtual, in a correspondingly low slope 1/M to inventively achieve a correspondingly reduced anamorphic image 6, 6', which, despite a large aspect ratio of at least 100, has a length 7 that is limited in such a way that no aberrations result that impair the image quality. The anamorphic image 6 is a diffraction image because $x_\gamma$ and $y_\delta$ are zero (FIGS. 2a and 2b). However, this is distorted by the effect of the quadrupole fields, that is, it is drawn apart in accordance with the anamorphosis of the image 6 in such a way that the zero beam 13 is in the region of the center of the length 7 and the electron beams 15 of higher orders of diffraction are disposed sequenced toward the outside with the higher orders of diffraction further out.

The aspect ratio is the ratio of the length 7 of the anamorphic image 6 to its width 7'. The large aspect ratio of $7/7' \geqq 100$ achieved in this way is then the basis for optimum separation of the region 14 of the zero beam 13 from the electron beams of higher orders of diffraction 15 (FIGS. 6a and 7b), enabling better phase contrast to be achieved. The choice of the magnification M of the intermediate image 5 should be made in such a way that, to achieve an aspect ratio of at least 100, the virtual diffraction intermediate image 28 constitutes an at least 20-fold reduction as compared with an original non-enlarged intermediate image. To achieve this magnification M of the intermediate image 5, the device must be integrated at an appropriate position into the projective lens system 18 of an electron microscope 31 at which such an intermediate image 5 of the magnification M is formed (see FIG. 5). Because the projective lens system 18, often also termed intermediate lenses (multiple) and projection lens (the last lens), usually includes such a large number of lenses with intermediate images that a corresponding magnification M of an intermediate image 5 can be selected, no detailed description of the beam path and lenses is required here to determine the installation location for the device 1, 2, 3. This depends on the equipment type, each of the devices 1, 2, 3 of the invention having to be adapted for the beam path and beam tube of each design type of an electron microscope.

Figure 2:
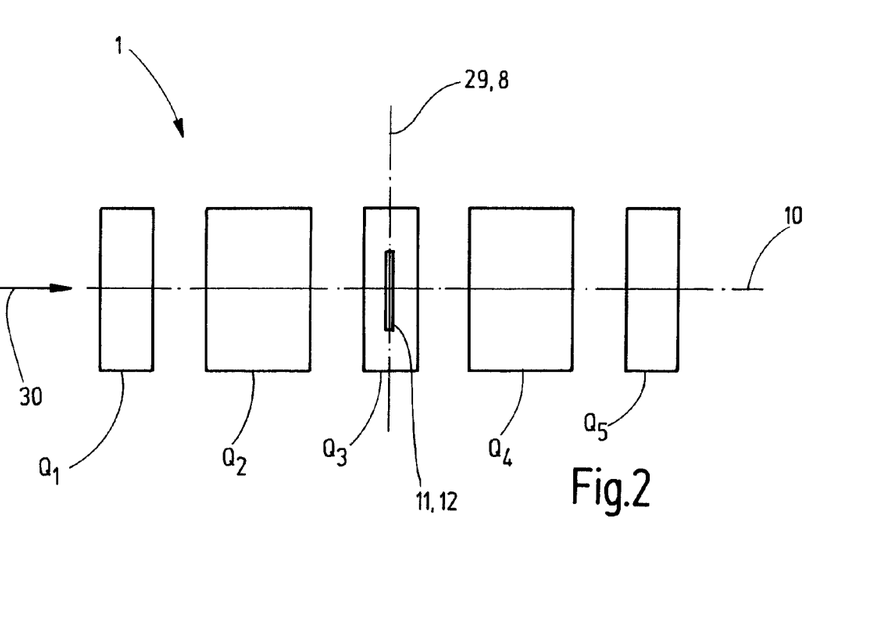
FIG. 2 a schematic representation of a simple structure of an inventive device.
Figure 2A:
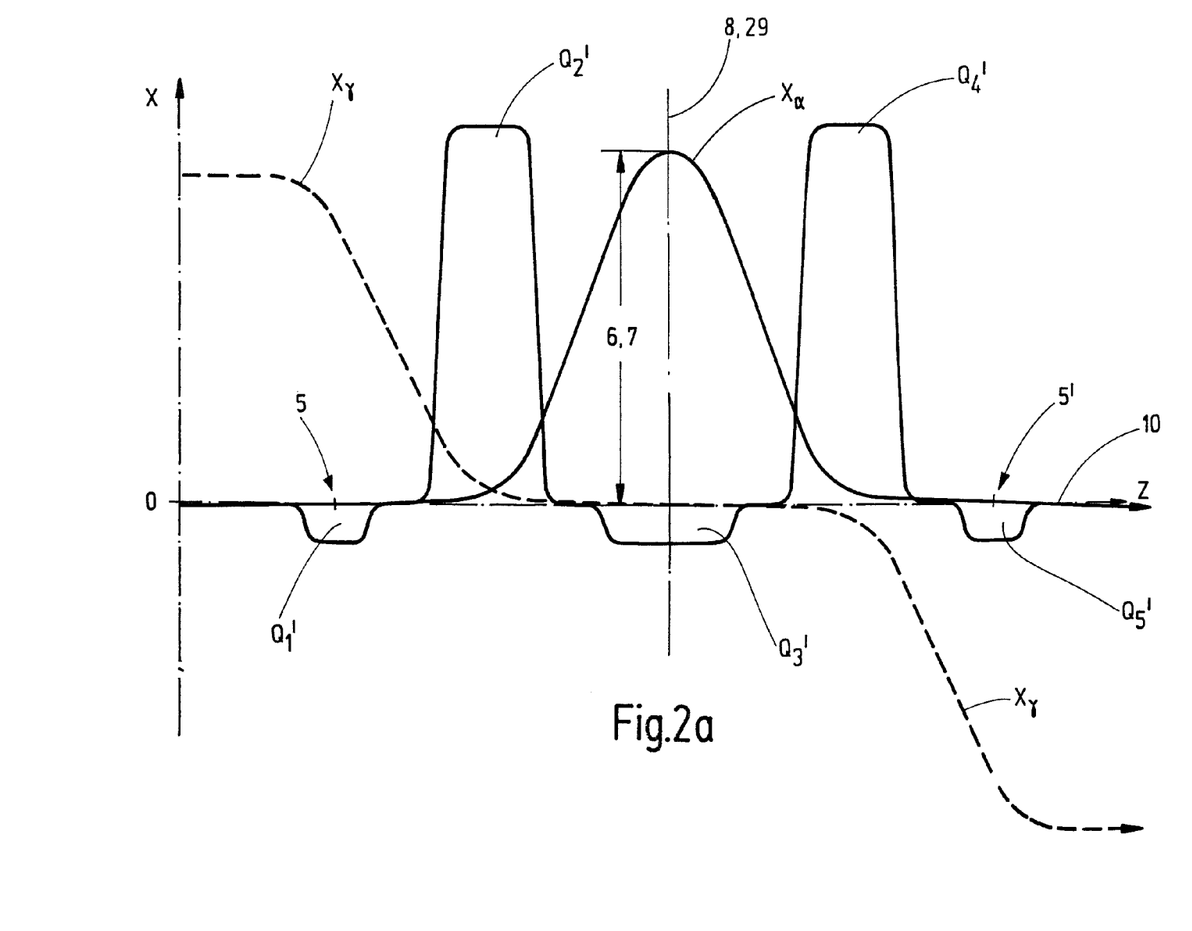
FIG. 2*a* its beam path in the x-section.
Figure 2B:
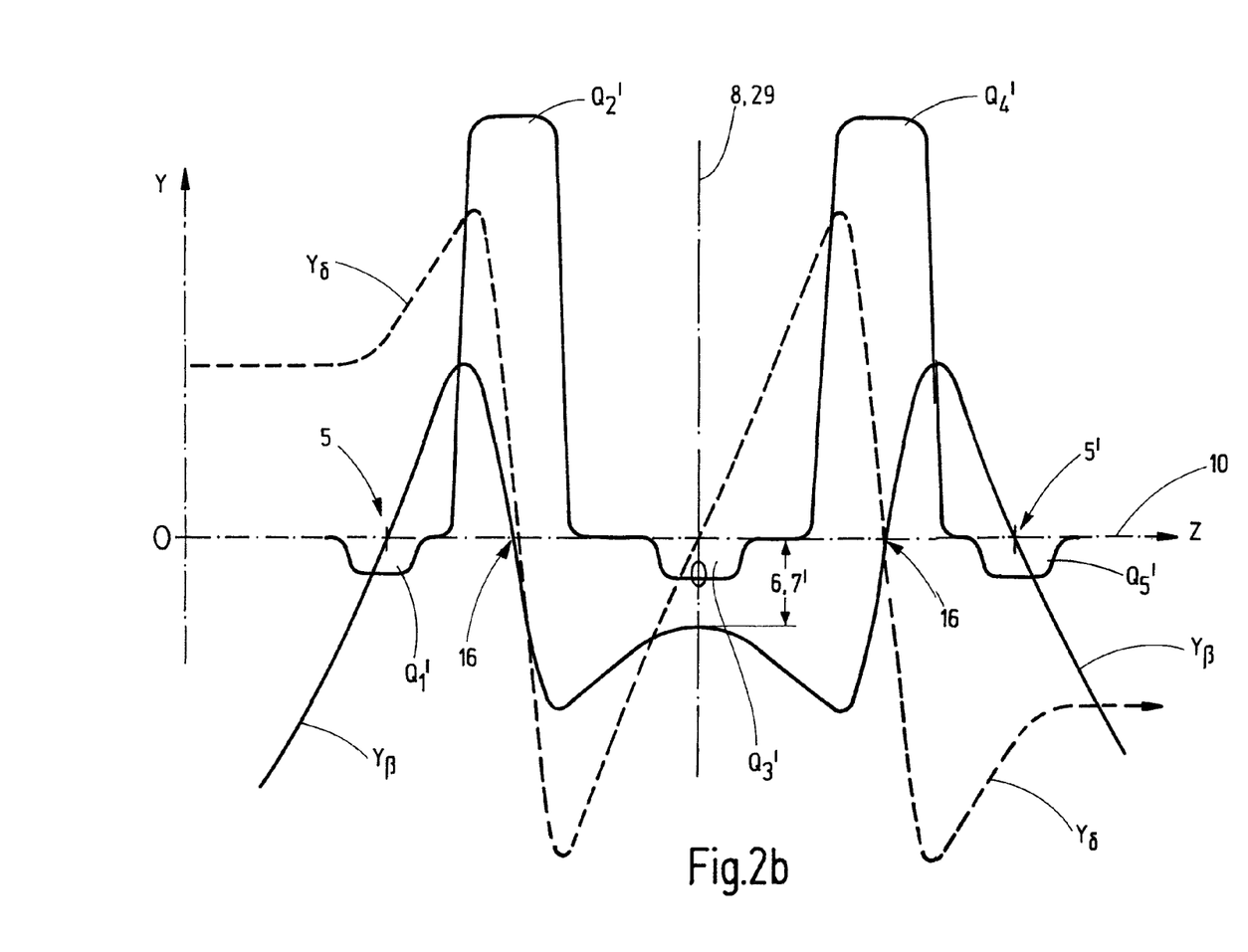
FIG. 2*b* its beam path in the y-section.

FIG. 2 shows a schematic representation of a simple structure of an inventive device 1. This consists of two entry-side quadrupole elements $Q_1$ and $Q_2$, a central quadrupole element $Q_3$ whose center forms a symmetry plane 29 and two exit-side quadrupole elements $Q_4$ and $Q_5$, quadrupole element $Q_4$ corresponding to quadrupole element $Q_2$ and quadrupole element $Q_5$ corresponding to quadrupole element $Q_1$. The phase-shifting element 11 or 12, of which various embodiments are possible, is disposed in the symmetry plane 29. The optical axis 10 and the beam path 30 are also drawn.

FIG. 2a shows the beam path of the device 1 according to FIG. 2 in the x-section. The quadrupole fields $Q_1'$, $Q_2'$, $Q_3'$, $Q_4'$, $Q_5'$ of the quadrupole elements $Q_1$, $Q_2$, $Q_3$, $Q_4$, $Q_5$ are drawn along the z-axis, with which the optical axis 10 coincides, showing that the symmetry plane 29 is in the center of the quadrupole field $Q_3'$. This symmetry plane 29 is the diffraction intermediate image plane 8, in which the phase-shifting element 11 or 12 is also located. The quadrupole fields $Q_2'$ and $Q_4'$, which are disposed before and after the diffraction intermediate image plane 8, have the same strength and their strength is such that they exhibit an extent in the direction of the optical axis 10 that is equal to at least twice the focal length without excessively increasing the overall height. The entry-side and exit-side quadrupole fields $Q_1'$ and $Q_5'$ have the same strength and are symmetrical with respect to the symmetry plane 29. They and the quadrupole field $Q_3'$ have reverse polarity to the quadrupole fields $Q_2'$ and $Q_4'$.

FIG. 2b shows the same beam path with the same quadrupole fields $Q_1'$, $Q_2'$, $Q_3'$, $Q_4'$, $Q_5'$ in the y-section.

In the sections x and y, the axial rays $x_\alpha$, $y_\beta$ and the field rays $x_\gamma$, $y_\delta$ are drawn as fundamental rays. However, different scales have been chosen with respect to the x- and y-axes to be able to draw the propagation of these rays $x_\alpha$, $y_\beta$, $x_\gamma$, $y_\delta$, in particular, because the $x_\alpha$ ray is deflected with respect to the $y_\beta$ ray to the extent that, with the same scale, either the deflection of the $y_\beta$ ray would not be visible or the $x_\alpha$ ray would extend beyond the edge of the sheet in the region of the symmetry plane 29. For this reason, the x- and y-axes have not been scaled with the same units of measure.

The device 1 is inserted in the beam path of the projective lens system 18 of an electron microscope 31, as described above (see FIG. 5), in such a way that an intermediate image 5 with an M-fold magnification of the specimen 4 is located in its entrance region (FIG. 1). Because the $x_\alpha$ and $y_\beta$ rays intersect the optical axis in the quadrupole field $Q_1'$ in the representation of FIGS. 2a and 2b, the intermediate image 5 is at that position. However, the intermediate image 5 does not necessarily have to be at that position; it could also be located before or after the quadrupole field $Q_1'$, preferably, however, before it. The important aspect is that the quadrupole fields $Q_1'$, $Q_2'$, $Q_3'$, $Q_4'$, $Q_5'$ are coordinated with the beam path of the electron microscope 31 in such a way that a diffraction intermediate image plane 8 with a diffraction intermediate image is located in the symmetry plane 29, that is, $x_\gamma$ and $y_\delta$ are zero there. This is also an anamorphic image 6 of the axial rays $x_\alpha$ and $y_\beta$.

Essential to the production of the anamorphic image 6 and its correction are the quadrupole fields $Q_2'$, $Q_4'$, which are drawn sufficiently strong to limit the axial extent, which is at least twice the focal length. They are used to produce an aspect ratio of at least 100 which, applied to the representation, means that the length 7 drawn in FIG. 2a of the anamorphic image 6 must be at least 100 times greater than the width 7' drawn in FIG. 2b. The greatly differing scales were taken to visualize that. So, in order to compare the $y_\beta$ ray with the $x_\alpha$ ray, the length 7 of the anamorphic image 6 would have to extend at least 100 times further in the direction of the x-axis than its width 7' in the direction of the y-axis.

The phase-shifting elements 11 or 12 with their fields 9, 9' are located in the diffraction intermediate image plane 8. These are not drawn in the representations in FIGS. 2a and 2b because they have no effect on the travel of the axial rays $x_\alpha$, $y_\beta$ and the field rays $x_\gamma$, $y_\delta$.

Figure 3:
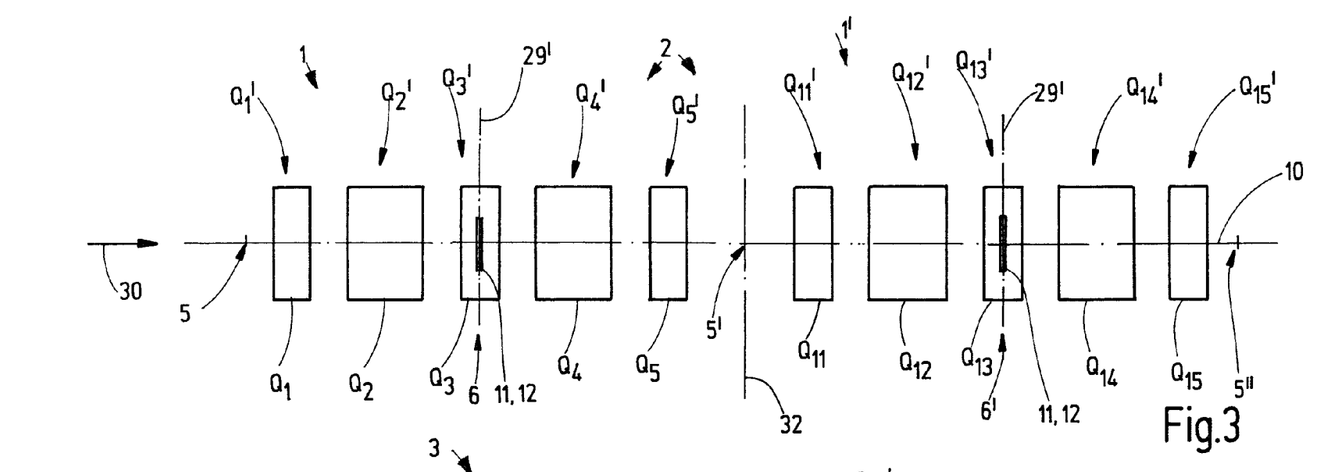
FIG. 3 a schematic representation of a structure that is double symmetrical of an inventive device.

FIG. 3 shows a schematic representation of a structure with double symmetry of an inventive device 2. The first part corresponds to the device 1 drawn in FIG. 2, which is disposed a second time thereafter as device 1'. The latter's quadrupole elements $Q_{11}$, $Q_{12}$, $Q_{13}$, $Q_{14}$, $Q_{15}$ correspond to the quadrupole elements $Q_1$, $Q_2$, $Q_3$, $Q_4$, $Q_5$ of the device 1, and they are disposed in the same way so that one symmetry plane 29' results in each of the devices 1 and 1', as does the symmetry of the device 2 through the central symmetry plane 32. Phase-shifting elements 11 or 12 are disposed in each of the two symmetry planes 29' to effect phase shifts in the anamorphic images 6 and 6'.

With respect to the quadrupole fields $Q_{11}'$, $Q_{12}'$, $Q_{13}'$, $Q_{14}'$, $Q_{15}'$ of the device 1', the symmetry plane 32 represents an anti-symmetry plane because these have opposite polarity compared with the fields $Q_1'$, $Q_2'$, $Q_3'$, $Q_4'$, $Q_5'$ of the device 1 (rotated through 90°, which amounts to the same thing).

Unlike device 1 according to FIG. 2, in the case of device 2 with double symmetry, the intermediate image 5 must be located before the first quadrupole element $Q_1$ because only in this way is it possible to produce a further intermediate image 5' of magnification M in the central symmetry plane 32 located after the quadrupole element $Q_5$. This is necessary for the anti-symmetrical path of the fundamental rays, that is, of the axial rays $x_\alpha$, $y_\beta$ and of the field rays $x_\gamma$, $y_\delta$. This ray path then produces a third intermediate image 5'' of magnification M after the last quadrupole element $Q_{15}$ of the second part 1' of device 2.

The path of the fundamental rays is explained with reference to the deviations from FIGS. 2a and 2b. One difference is that the axial rays $x_\alpha$, $y_\beta$ must extend into the images (FIGS. 2a, 2b) in such a way that they are zero before the first quadrupole field $Q_1'$, so that, as mentioned above, the intermediate image 5 is before the first quadrupole element $Q_1$ and therefore the further intermediate image 5' can be after the quadrupole element $Q_5$ in the central symmetry plane 32.

FIGS. 2a and 2b therefore show—taking the above difference into account—the travel of the fundamental paths in the first device part 1 of the device 2. In the second device part 1', the axial ray $x_\alpha$ in the x-section (FIG. 2a) has a dependence that corresponds to the axial ray $y_\beta$ of the y-section (FIG. 2b), but is rotated through 180° about the z-axis. Because of the different scales, the negative slope of the axial ray $x_\alpha$ as it exits FIG. 2a is identical with the negative slope of $y_\beta$ on entry into FIG. 2b if $y_\beta$ is imagined as being rotated 180° about the z-axis.

Conversely, for the device 2 with a structure with double symmetry, the further travel of the axial path $y_\beta$ after the representation of the y-section in FIG. 2b must be imagined to continue according to the axial path $x_\alpha$ of FIG. 2a, but rotated through 180° about the z-axis, and again taking the difference in scale into account. The same exchanged roles are found accordingly in the case of the field rays $x_\gamma$ and $y_\delta$. In this case too, the different scales must be noted although they are much slighter.

Separate representation of these fundamental ray paths of the device 2 with double symmetry was dispensed because identical scales could not be drawn. Either the rays that determine the widths 7' of the anamorphic images 6 and 6', that is, the axial beam $y_\beta$ in the case of device 1 and the axial beam $x_\alpha$ in the case of device 1', would not separate far enough from the z-axis to discern this in the drawing, or the rays that determine the length 7 of the anamorphic images 6 and 6', that is, the axial ray $x_\alpha$ in the case of device 1 and the axial ray $y_\beta$ in the case of device 1', could not be represented in the available space.

Figure 4:
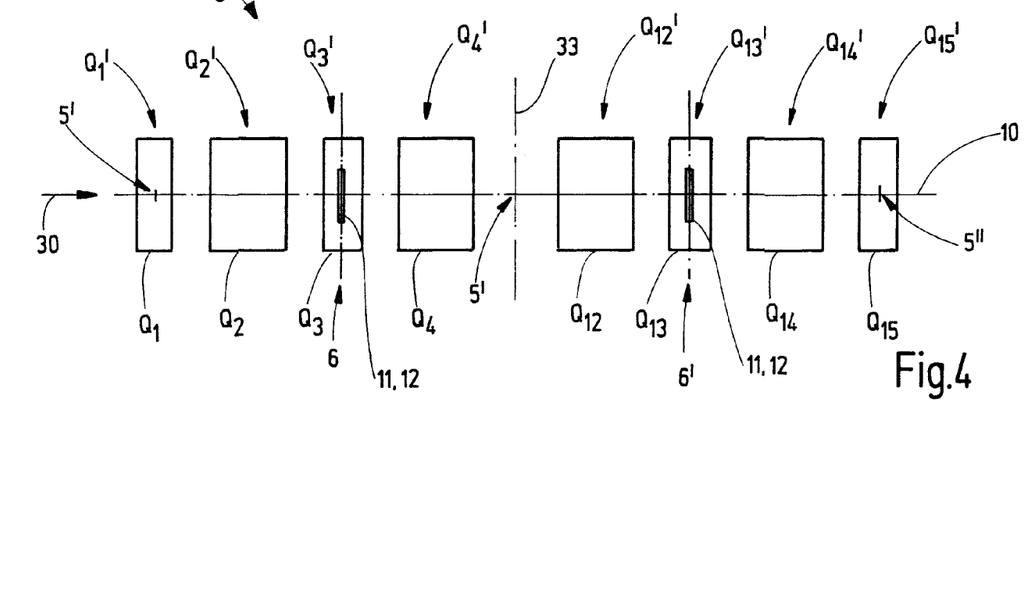
FIG. 4 a schematic representation of an inventive device, in which two quadrupoles have been omitted compared with double symmetry.

FIG. 4 shows a schematic representation of an inventive device 3, in which the two quadrupole elements $Q_5$ and $Q_{11}$ have been omitted compared with device 2 with a structure with double symmetry (FIG. 3), so that only the first device part with the quadrupole elements $Q_1$, $Q_2$, $Q_3$, and $Q_4$ is symmetrical with respect to symmetry plane 33 with the second device part with the quadrupole elements $Q_{12}$, $Q_{13}$, $Q_{14}$, $Q_{15}$. There is therefore no double symmetry. In this case, too, the quadrupole fields $Q_{12}'$, $Q_{13}'$, $Q_{14}'$, $Q_{15}'$ of the second device part have reversed polarity compared with the quadrupole fields $Q_1'$, $Q_2'$, $Q_3'$, $Q_4'$ of the first device part and a further intermediate image 5' of magnification M must be formed in the symmetry plane 33 for this purpose. However, the first intermediate image 5 of magnification M does not have to be before the first quadrupole element $Q_1$ but can be located there. It can also be located in the region of the first quadrupole element $Q_1$, as drawn in the figure.

The fundamental ray path corresponds to the description of the device 2 with a structure with double symmetry with the difference that the x-section (FIG. 2a) after the quadrupole field $Q_4'$, omitting quadrupole field $Q_5'$, has the symmetry plane 33, which is an anti-symmetrical plane with respect to the following quadrupole fields $Q_{12}'$, $Q_{13}'$, $Q_{14}'$, $Q_{15}'$ because these have reversed polarity. After this symmetry plane 33, the quadrupole field $Q_{11}'$ is similarly omitted so that the fundamental paths of the axial rays $x_\alpha$, $y_\beta$ and the field rays $x_\gamma$, $y_\delta$ are transferred from the quadrupole field $Q_4'$ to the quadrupole field $Q_{12}'$. In this case, too, the axial ray $x_\alpha$ of the x-section (FIG. 2a) is, for example, continued after field $Q_4'$, like the axial ray $y_\beta$ drawn in FIG. 2b. However, the latter is rotated through 180° about the z-axis and only starts before the quadrupole field $Q_{12}'$ because the quadrupole field $Q_{11}'$ is omitted. In the same way, the roles are also exchanged with respect to the axial ray $y_\beta$, omitting the quadrupole fields $Q_5'$ and $Q_{11}'$, as is also the case for the field rays $x_\gamma$ and $y_\delta$. For the scales, the above description applies accordingly.

Because in this device 3, however, the double symmetry is missing, the correction effects of the quadrupole elements are incomplete. For that reason, a correction must be performed that results in the slopes of the fundamental paths $x_\alpha$, $y_\beta x_\gamma$, $y_\delta$ on transfer from quadrupole field $Q_4'$ to quadrupole field $Q_{12}$ being such that the fundamental path progressions $x_\alpha$, $y_\beta$, $x_\gamma$, $y_\delta$ continue anti-symmetrically after the symmetry plane 33 with the described role change. This correction is effected by being able to set the quadrupole elements $Q_2'$ and $Q_4'$ in such a way that their quadrupole fields $Q_2'$ and $Q_4'$ exhibit deviations in their strength. This correction is made in one or in the other direction ($Q_2'>Q_4'$ or $Q_4'>Q_2'$) until the further intermediate image 5' of magnification M is located precisely in symmetry plane 33.

However, because the anti-symmetry of the quadrupole fields $Q_1'$, $Q_2'$, $Q_3'$, $Q_4'$ and $Q_{12}'$, $Q_{13}'$, $Q_{14}'$, $Q_{15}'$ with respect to symmetry plane 33 must be preserved, the quadruple fields $Q_{12}'$ and $Q_{14}'$ must be set in such a way that the strength of the quadrupole field $Q_{12}'$ corresponds to the strength of the quadrupole field $Q_4'$ and the strength of the quadrupole field $Q_{14}'$ corresponds to the strength of the quadrupole field $Q_2'$. The latter correction can be made in a result-oriented manner by varying the ratio of the strengths of quadrupole field $Q_{12}'$ to quadrupole field $Q_{14}'$ until the third intermediate image 5" is symmetrical with respect to the distance from the symmetry plane 33 and the magnification M of the intermediate image 5. A slight deviation from the anti-symmetry of the quadrupole fields $Q_2'$ and $Q_4'$ to $Q_{12}'$ and $Q_{14}'$ can be set to compensate for manufacturing imprecision of the electron optical components.

In the case of the two devices 2 and 3 described above, the second anamorphic image 6' is rotated through 90° with respect to the first anamorphic image 6. Therefore the disposition of the phase-shifting elements in 11, 12 must also correspond to the position in each case of these anamorphic images 6, 6'.

Figure 5:
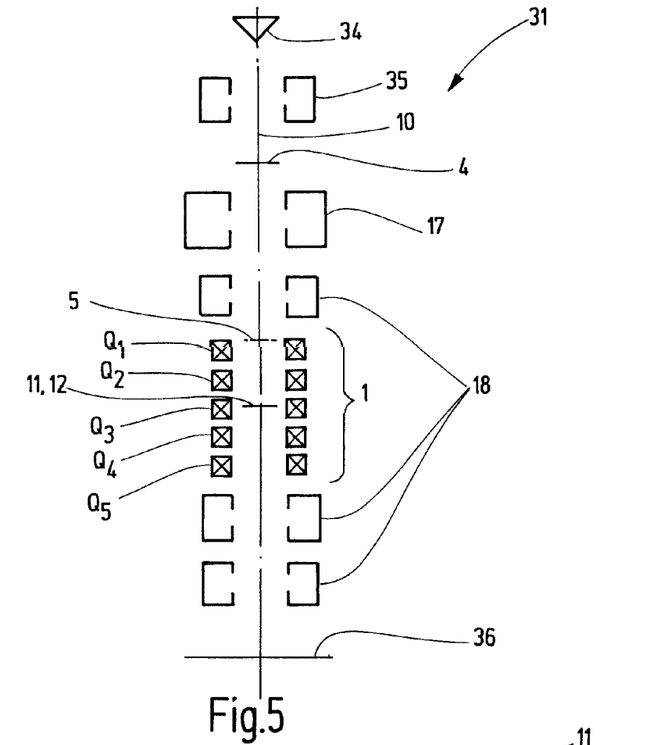
FIG. 5 a schematic representation of an electron microscope with a built-in inventive device.
Figure 6:
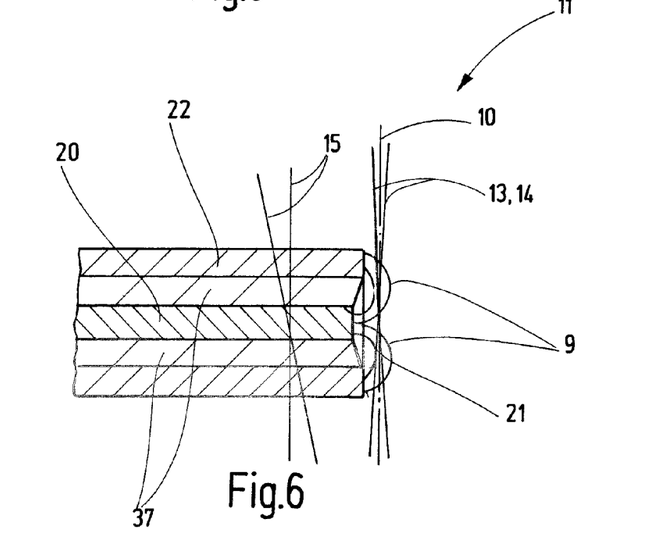
FIG. 6 an embodiment of a phase-shifting element for influencing the region of a zero beam.

FIG. 5 shows a schematic representation of an electron microscope 31 with an inventive device installed, represented by the example of device 1. The electron microscope 31 comprises, along an optical axis 10, a beam source 34, a condenser 35, the specimen 4, the objective lens 17, a projective lens system 18, and a projection surface 5. The device 1 is disposed in the region of the projective lens system 18, which comprises multiple single lenses—3 lenses are drawn by way of example. Of course, device 2 or a device 3 could be disposed in a similar way. For such a disposition, an intermediate image 5 of the desired magnification M is chosen in the region of the projective lens system 18 and then the device 1, 2, or 3 can be disposed in such a way that the position of the intermediate image 5 with respect to these devices is as shown in FIGS. 2a, 2b, 3, or 4:

FIG. 6 shows an embodiment of a phase-shifting element 11 for influencing the region 14 of the zero beam 13. This phase-shifting element 11 extends from the housing wall of the beam tube of the electron microscope 31 up to just before the optical axis 10 in such a way that the end 21 of a shielded conductor 20 produces an electrical field 9 that affects the region 14 of the zero beam 13. The electron beams 15 with higher orders of diffraction are not influenced. The electric field 9 extends from the conductor 20 to a shield 22 that surrounds the conductor 20, including an insulator 37.

Figure 6A:
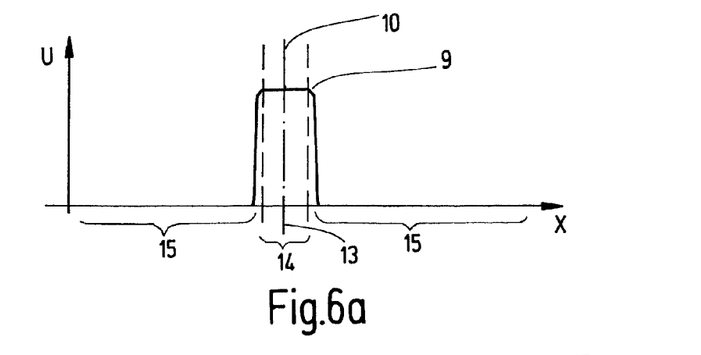
FIG. 6a a potential distribution of this phase-shifting element.

FIG. 6a shows the potential distribution of the field 9 of the phase-shifting element 11. The potential U is plotted versus the x-axis, showing that an electric field 9 is applied only in the region 14 of the zero beam 13 and that no electric field is present in the region of the electron beams 15 of higher orders of diffraction. In this way, such a field 9 can be applied depending on the embodiments described above that, for example, a phase shift of 45° or 90° is possible. Because extension of the phase-shifting element 11 through the region of the electron beams 15 of higher orders of diffraction causes the latter to be partially shaded, reconstruction is necessary by a known method.

Figures 7, 7A:
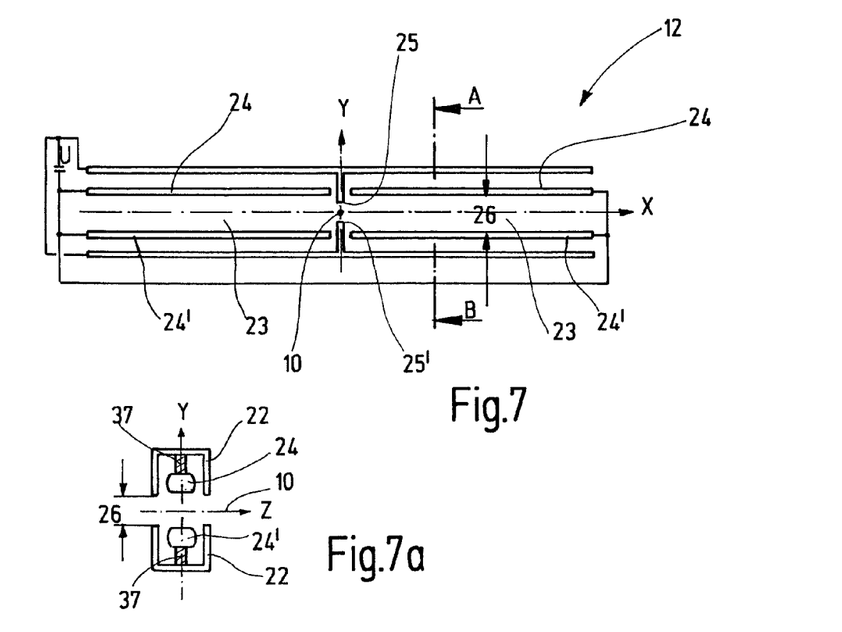
FIG. 7 an embodiment of a phase-shifting element for influencing the diffracted beams.
FIG. 7a a cross-section A-B through the phase-shifting element according to FIG. 7.

FIG. 7 shows an embodiment of a phase-shifting element 12 for influencing the electron beams 15 of higher orders of diffraction. FIG. 7a shows a cross-section A-B through this phase-shifting element 12 according to FIG. 7, as is drawn there. In the case of the phase-shifting element 12, electrodes 24 and 24' that are interrupted in the region of the optical axis 10 are disposed along a slot 23. In this region of the optical axis 10, on both sides of the slot 23, conductors 25 and 25' at zero potential 19 ensure on both sides that the field 9' is interrupted. The electrodes 24 and 24' are surrounded outside the slot 23 by a U-shaped shield 22, insulators 37 being disposed between the electrodes 24 and 24' and the shield 22. The z-axis extends in the direction of the optical axis 10 and the x-axis extends along the horizontal axis of FIG. 7. The slot 23 exhibits a width 26 that is dimensioned in such a way that the width 7' of the anamorphic image 6 just about fits through the slot 23. The slot 23 is a little longer than the length 7 of the anamorphic image 6. Moreover, the connection of electrodes 24 and 24' and the shielding 22 and the conductors 25 and 25' connected with this at zero potential 19 are shown with a voltage source U.

Figure 7B:
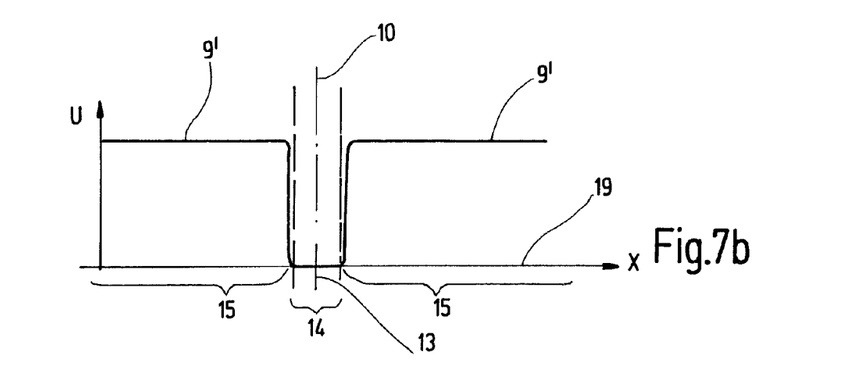
FIG. 7b the potential distribution of this phase-shifting element.

FIG. 7b shows how an electric field 9' is applied in the region of the electron beams 15 of higher orders of diffraction by means of electrodes 24 and 24'. The potential U of the electric field 9' is dimensioned according to the desired phase shift, as has already been explained above. Because the conductors 25, 25' are at zero potential 19, it is ensured that the region 14 of the zero beam 13 is at zero potential 19.

The drawings are, of course, only examples so that the inventive devices 1, 2, or 3 can exhibit further elements for further purposes or the functions of the quadrupole elements drawn can be distributed over multiple quadrupole elements.

The phase-shifting elements 11 and 12 are only two embodiments. To produce application in the region 14 of the zero beam 13 or in the region of the electron beams 15 of higher orders of diffraction, further phase-shifting elements with the same function, of which various embodiments are known in the prior art, can be used accordingly.

Reference List $Q_1$, $Q_5$ Quadrupole elements at the entry and exit side of the device $Q_2$, $Q_4$ Quadrupole elements before and after the diffraction intermediate image plane $Q_3$ Central quadrupole element $Q_{11}$, $Q_{12}$, $Q_{13}$, $Q_{14}$, $Q_{15}$ Quadrupole elements as stated above in the second half of a double configuration $Q_1'$, $Q_2'$, $Q_3'$, $Q_4'$, . . . , $Q_{15}'$ Quadrupole fields of the quadrupole elements as stated above $x_\alpha$, $y_\beta$ Axial rays $x_\gamma$, $y_\delta$ Field rays 1 Device for image contrast production, structure with a single symmetry plane 1' Device for image contrast production, like 1 but with reversed polarity 2 Device for image contrast production, structure double symmetrical (1=first device part, 1'=second device part)

3 Device for image contrast production with simplification of the double symmetrical structure 4 Specimen
5 Intermediate image with magnification M
5' Further intermediate image with magnification M
5" Third intermediate image with magnification M
6 Anamorphic image
6' Further anamorphic image
7 Length of the anamorphic image
7' Width of the anamorphic image
8 Diffraction intermediate image plane
8' Further diffraction intermediate image plane
9 Electric field, applied in the region of the zero beam
9' Electric field, applied in the region of the diffracted beams
10 Optical axis
11 Phase-shifting element, first embodiment
12 Phase-shifting element, second embodiment
13 Zero beam (electron beam of zeroth order of diffraction)
14 Region of the zero beam
15 Electron beams of higher orders of diffraction
16 Astigmatic intermediate image in the region of the quadrupole fields $Q_2'$, $Q_4'$ or $Q_{12}'$, $Q_{14}'$
17 Objective lens
18 Projective lens system
19 Zero potential
20 Shielded conductor
21 End of the shielded conductor
22 Shield
23 Slot
24, 24' Electrodes
25, 25' Conductors at zero potential
26 Width of the slot
27 Diffraction intermediate image between objective lens and device
28 Reduced virtual diffraction intermediate image
29 Symmetry planes of the device 1
29' Corresponding symmetry planes of the individual parts of a stucture 2 with double symmetry
30 Beam path
31 Electron microscope
32 Central symmetry plane (device) or anti-symmetry plane (fields) of the device 2 with a structure with double symmetry
33 Symmetry plane in a device 3
34 Beam source
35 Condenser
36 Projection surface
37 Insulator

We claim:

1. A method for producing image contrast by phase shifting in electron optics, the method comprising the steps of:
 a) producing an anamorphic image of axial rays from an intermediate image of the axial rays using first quadrupole fields disposed upstream of the anamorphic image with simultaneous passage through zero of field beams in at least one diffraction image plane;
 b) effecting a relative phase shift between a region around the electron beam of zeroth order of diffraction and electron beams of higher orders of diffraction using a magnetic or electric field;
 c) correcting the anamorphic image using at least one downstream second quadrupole field; and
 d) appropriately selecting a magnification M of the intermediate image such that at least one of the axial rays enters the first quadrupole fields at a slope 1/M such that a length of the anamorphic image is achieved at which aberrations caused are still within a tolerable range, wherein the first and the second quadrupole fields have an extent in a direction of an optical axis which is at least twice as large as focal lengths thereof.

2. The method of claim 1, wherein only one anamorphic image is produced.

3. The method of claim 2, wherein the magnetic or electric field affecting the anamorphic image has a field strength such that a relative phase shift of approximately 90° is caused.

4. The method of claim 1 wherein an anti-symmetrical beam path leads to two anamorphic images rotated through 90°, wherein an anti-symmetry in a second configuration of quadrupole fields with respect to a first configuration of quadrupole fields is caused by the second configuration having a same magnitude or an essentially same magnitude but reverse polarity.

5. The method of claim 4, wherein an anti-symmetry plane is selected such that an intermediate image with magnification M located before the first quadrupole field is formed as a further intermediate image of magnification M in this plane and a third intermediate image is formed after the quadrupole field.

6. The method of claim 4, wherein the magnetic or electric fields acting on each anamorphic image have a field strength such that a relative phase shift of approximately 45° is caused.

7. The method of claim 1, wherein the magnetic or electric field is applied in a region of a zero beam.

8. The method of claim 1, wherein the magnetic or electric field is applied in a region of diffracted beams.

9. The method of claim 1, wherein quadrupole fields for production and correction of the anamorphic image exhibit an extent in a direction of the optical axis and a strength such that an astigmatic intermediate image results in a region affected thereby.

10. The method of claim 9, wherein a strength of the quadrupole fields is selected with a magnitude and an axial extent of the fields to permit insertion into the optical system of an electron microscope without exceeding an acceptable overall height.

11. The method of claim 10, wherein an anamorphic image with an aspect ratio greater than 100 is achieved.

12. The method of claim 11, wherein an anamorphic image with an aspect ratio greater than 200 is achieved.

13. A device for producing image contrast by phase shifting in electron optics, the device comprising:
 means for producing a first anamorphic image of axial rays from an intermediate image of the axial rays using first quadrupole fields disposed upstream of the first anamorphic image with simultaneous passage through zero of field beams in at least one diffraction image plane;
 means for effecting a relative phase shift between a region around the electron beam of zeroth order of diffraction and electron beams of higher orders of diffraction using a magnetic or electric field;
 means for correcting said first anamorphic image using at least one downstream second quadrupole field; and
 means for appropriately selecting a magnification M of said intermediate image such that at least one of said axial rays enters said first quadrupole fields at a slope 1/M such that a length of said first anamorphic image is achieved at which aberrations caused are still within a tolerable range, wherein said first and said second quadrupole fields have an extent in a direction of an optical axis which is at least twice as large as focal lengths thereof.

14. The device of claim 13, wherein said first quadrupole fields are generated by a first quadrupole element and a second quadrupole element and said at least one second quadrupole field is generated by a fourth quadrupole element and a fifth quadrupole element, wherein said first and said second quadrupole elements produce quadrupole fields which focus and defocus said axial rays and said field beams from said intermediate image in two perpendicular sections such that said axial rays form said first anamorphic image and said field beams each pass through zero at a diffraction intermediate image plane, and further comprising a third central quadrupole element disposed at said diffraction intermediate image plane, said third quadrupole element producing a third quadrupole field which causes said axial rays to exit said third field with slopes opposite to those at entry into said third quadrupole element, wherein said fourth and said fifth quadrupole elements produce quadrupole fields having a same magnitude and sign as quadrupole fields produced by said first and said second quadrupole elements, thereby correcting beam path anamorphosis, wherein said phase shift effecting means comprises a first phase-shifting element disposed at said diffraction intermediate image plane, the device being structured and dimensioned for disposition at a position of a beam path of a projective lens system of an electron microscope at which said axial rays enter said quadrupole field of said second quadrupole element downstream of said intermediate image of magnification M with said slope 1/M.

15. The device of claim 14, wherein said first phase-shifting element is constituted to produce a magnetic or electric field causing a relative phase shift of approximately 90°.

16. The device of claim 14, wherein said first, second, third, fourth and fifth quadrupole elements constitute a first device and further comprising a second device disposed downstream of said first device on the optical axis, said second device having a sixth quadrupole element corresponding to said first quadrupole element, a seventh quadrupole element corresponding to said second quadrupole element, an eighth quadrupole element corresponding to said third quadrupole element, a ninth quadrupole element corresponding to said fourth quadrupole element and a tenth quadrupole element corresponding to said fifth quadrupole element, wherein said sixth through tenth quadrupole elements have reverse polarity such that a second anamorphic image of said second device is rotated through 90° with respect to said first anamorphic image of said first device, wherein an entire device consisting of said first device and said second device is structured and dimensioned for disposition in said beam path of said projective lens system of said electron microscope with said intermediate image being located upstream of said first quadrupole element, wherein a further intermediate image of magnification M is formed in a symmetry plane which is central between said first and said second devices, a second phase-shifting element of said second device being disposed in such a way as to provide magnetic or electric fields for a relative phase shift between a region of the electron beam of zeroth order of diffraction and electron beams of higher orders of diffraction at said second anamorphic image.

17. The device of claim 16, wherein said first and said second phase-shifting elements exhibit magnetic or electric fields that cause a relative phase shift of approximately 45°.

18. The device of claim 13, wherein said first quadrupole fields are generated by a first quadrupole element and a second quadrupole element and said at least one second quadrupole field is generated by a fourth quadrupole element, wherein said first and said second quadrupole elements produce quadrupole fields which focus and defocus said axial rays and said field beams from said intermediate image in two perpendicular sections such that said axial rays form said first anamorphic image and said field beams each pass through zero at a diffraction intermediate image plane, and further comprising a third central quadrupole element disposed at said diffraction intermediate image plane, said third quadrupole element producing a third quadrupole field which causes said axial rays to exit said third field with slopes opposite to those at entry into said third quadrupole element, wherein said phase shift effecting means comprises a phase-shifting element disposed at said diffraction intermediate image plane, the device being structured and dimensioned for disposition at a position of a beam path of a projective lens system of an electron microscope at which said axial rays enter said quadrupole field of said second quadrupole element downstream of said intermediate image of magnification M with said slope 1/M, wherein said first, second, third, and fourth quadrupole elements constitute a first device and further comprising a second device disposed downstream of said first device on an optical axis, said second device having a fifth quadrupole element corresponding to said fourth quadrupole element, a sixth quadrupole element corresponding to said third quadrupole element, a seventh quadrupole element corresponding to said second quadrupole element, and an eighth quadrupole element corresponding to said first quadrupole element, wherein said fourth through eighth quadrupole elements generate respective fields which are essentially equal to those respectively generated by said respective corresponding first through fourth quadrupole elements, but rotated through 90°, wherein an entire device consisting of said first device and said second device is structured and dimensioned for disposition in said beam path of said projective lens system of said electron microscope, a second phase-shifting element of said second device being disposed in such a way as to provide magnetic or electric fields for a relative phase shift between a region of the electron beam of zeroth order of diffraction and electron beams of higher orders of diffraction at a second anamorphic image, wherein said second and said fourth quadrupole elements have an extent in a direction of said optical axis that is at least twice as large as focal lengths thereof and fields generated by said second and said fourth quadrupole elements can be set to deviate from each other in such a way that said axial rays form a further intermediate image of magnification M and said field beams intersect each other at a symmetry plane centered between said first and said second device, wherein said fifth and said seventh quadrupole elements can also be set to deviate so that a third intermediate image of size M results at the end of the second device, wherein said axial rays and said field beams traverse said second device in said x-section as they previously did in said first device in said y-section and said y-section as previously in said x-section, wherein a second diffraction intermediate image plane with a second anamorphic image that is rotated through 90° with respect to said first anamorphic image is formed at said sixth quadrupole element, said second phase-shifting element being disposed at said second diffraction intermediate image plane.

19. The device of claim 18, wherein said first and said second phase-shifting elements exhibit magnetic or electric fields that cause a relative phase shift of approximately 45°.

20. The device of claim 13, wherein quadrupoles for production and correction of at least one anamorphic image exhibit an extent in a direction of the optical axis and are constituted for field production such that an astigmatic intermediate image can be produced in a region affected thereby.

21. The device of claim 20, wherein said quadrupoles are built for producing quadrupole fields of sufficient strength having an extent leading to an overall height of the devices which is small enough to ensure easy installation into an electron microscope.

22. The device of claim 13, wherein said phase shift effecting means is constituted such that a magnetic or electric field can be applied in a region of a zero beam while a region of diffracted beams is at zero potential.

23. The device of claim 22, wherein said phase shift effecting means for production of an electric field is constituted as a shielded conductor that, departing from the a fixture on a housing wall, is essentially disposed radially in a direction of the region of the zero beam in a diffraction intermediate image plane, wherein said shielded conductor exhibits, before the region of the zero beam, an end positioned in such a way that an electric field is formed between the conductor and the shielding surrounding it that affects the region of the zero beam.

24. The device of claim 13, wherein said phase shift effecting means is constituted in such a way that a region of a zero beam is at zero potential and a magnetic or electric field can be applied in a region of the diffracted beams.

25. The device of claim 24, wherein said phase shift effecting means for production of an electric field has a slot that encloses said first anamorphic image, wherein electrodes for application of the electric field that are each interrupted by one conductor at zero potential for the region of a zero beam in the region of the optical axis extend along the slot on both sides thereof.

26. The device of claim 25, wherein quadrupoles before and after said diffraction intermediate image plane produce fields such that a width of said first anamorphic image closely fits into said width of said slot.

27. The device of claim 13, wherein field strengths can be produced with quadrupoles and the device can be disposed at such a position in a beam path of a projective lens system of an electron microscope that said magnification M of said intermediate image results in a slope 1/M of the axial rays such that an aspect ratio of said first anamorphic image is greater than 100.

28. The device of claim 27, wherein field strengths can be produced with quadrupoles and the device can be disposed at such a position in the beam path of the projective lens system of an electron microscope that the magnification M of the intermediate image results in a slope 1/M of the axial rays such that the aspect ratio of said first anamorphic image is greater than 200.

* * * * *